United States Patent
Konishi et al.

(10) Patent No.: US 9,159,562 B2
(45) Date of Patent: Oct. 13, 2015

(54) TRENCH TYPE SCHOTTKY JUNCTION SEMICONDUCTOR DEVICE AND MANUFACTURING METHOD THEREOF

(71) Applicant: Hitachi, Ltd., Tokyo (JP)

(72) Inventors: Kumiko Konishi, Kokubunji (JP); Natsuki Yokoyama, Mitaka (JP); Norifumi Kameshiro, Tokyo (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 13/665,311

(22) Filed: Oct. 31, 2012

(65) Prior Publication Data

US 2013/0105820 A1    May 2, 2013

(30) Foreign Application Priority Data

Oct. 31, 2011    (JP) .................. 2011-238190

(51) Int. Cl.

| H01L 21/04 | (2006.01) |
|---|---|
| H01L 29/47 | (2006.01) |
| H01L 29/872 | (2006.01) |
| H01L 29/66 | (2006.01) |
| H01L 29/861 | (2006.01) |
| H01L 29/78 | (2006.01) |
| H01L 29/16 | (2006.01) |
| H01L 29/06 | (2006.01) |

(52) U.S. Cl.
CPC .......... *H01L 21/046* (2013.01); *H01L 21/0475* (2013.01); *H01L 29/0615* (2013.01); *H01L 29/47* (2013.01); *H01L 29/66068* (2013.01); *H01L 29/66136* (2013.01); *H01L 29/66143* (2013.01); *H01L 29/7827* (2013.01); *H01L 29/8611* (2013.01); *H01L 29/872* (2013.01); *H01L 29/1608* (2013.01)

(58) Field of Classification Search
None
See application file for complete search history.

(56) References Cited

U.S. PATENT DOCUMENTS

| 5,262,669 | A | * | 11/1993 | Wakatabe et al. | 257/483 |
| 5,345,100 | A | | 9/1994 | Kan et al. | |
| 5,365,102 | A | * | 11/1994 | Mehrotra et al. | 257/475 |
| 2003/0020135 | A1 | * | 1/2003 | Kaminski et al. | 257/484 |

FOREIGN PATENT DOCUMENTS

| JP | 4-321274 A | 11/1992 |
| JP | 5-136015 A | 6/1993 |

* cited by examiner

*Primary Examiner* — Steven Loke
*Assistant Examiner* — Juanita B Rhodes
(74) *Attorney, Agent, or Firm* — Miles & Stockbridge PC

(57) ABSTRACT

A Schottky junction type semiconductor device in which the opening width of a trench can be decreased without deteriorating the withstanding voltage. The cross sectional shape of a trench has a shape of a sub-trench in which the central portion is higher and the periphery is lower at the bottom of the trench, and a p type impurity is introduced vertically to the surface of the drift layer thereby forming a $p^+$ SiC region, which is formed in contact to the inner wall of the trench having the sub-trench disposed therein, such that the junction position is formed more deeply in the periphery of the bottom of the trench than the junction position in the central portion of the bottom of the trench.

5 Claims, 13 Drawing Sheets

FIG. 9C
ION IMPLANTATION

TRENCH TYPE SCHOTTKY JUNCTION SEMICONDUCTOR DEVICE AND MANUFACTURING METHOD THEREOF

CLAIM OF PRIORITY

The present application claims priority from Japanese patent application JP 2011-238190 filed on Oct. 31, 2011, the content of which is hereby incorporated by reference into this application.

FIELD OF THE INVENTION

The present invention concerns a trench type Schottky junction semiconductor device.

BACKGROUND OF THE INVENTION

For power semiconductor devices, high withstanding voltage, as well as low on resistance and low switching loss are required, but silicon (Si) power devices, as a current main stream, are close to their theoretical performance Since silicon carbide (SiC) has a dielectric breakdown field strength larger, by about one digit than Si, the device resistance can be decreased theoretically by three digits or more by decreasing the thickness of a drift layer for maintaining withstanding voltage as low as to about $\frac{1}{10}$ and increasing the impurity concentration by about 100 times. Further, since SiC has a band gap Larger by about three times than that of Si and high temperature operation is also possible, performance exceeding that of Si can be expected.

Among the power semiconductor devices using SiC, research and development have been progressed particularly for unipolar type Schottky barrier diodes (SBD).

Since the Si diode, as a current main stream, is a bipolar type that operates on two kinds of carriers of holes and electrons, a recovery current due to discharge of excessive minor carriers is generated upon switching to result in switching loss. On the other hand, since SBD is a unipolar type that operates only on the electrons, no recovery current is generated theoretically and the switching loss can be decreased drastically. However, when a high voltage SBB is intended to be attained by Si, since the dielectric breakdown field strength is small, the thickness of the drift layer increases and the concentration of impurity is lowered. As a result, since the device resistance increases remarkably, it is not suitable to practical use. On the other hand, since SiC has high dielectric breakdown strength, high performance SBD with low device resistance even at high withstanding voltage can be attained. However, SBD involves a problem that reverse leak current is large in view of the structure.

The leak current can be decreased by decreasing the electric field strength at the Schottky interface. For this purpose, a junction barrier Schottky (JBS) structure of hybridizing a pn junction to the Schottky interface of SiC has been proposed. Upon application of a reverse voltage, a depletion layer diffuses from a pn junction to exhibit pinch-off below the Schottky junction region. Therefore, an electric field at the Schottky junction interface is decreased and the leak current can be decreased.

Figure 17:
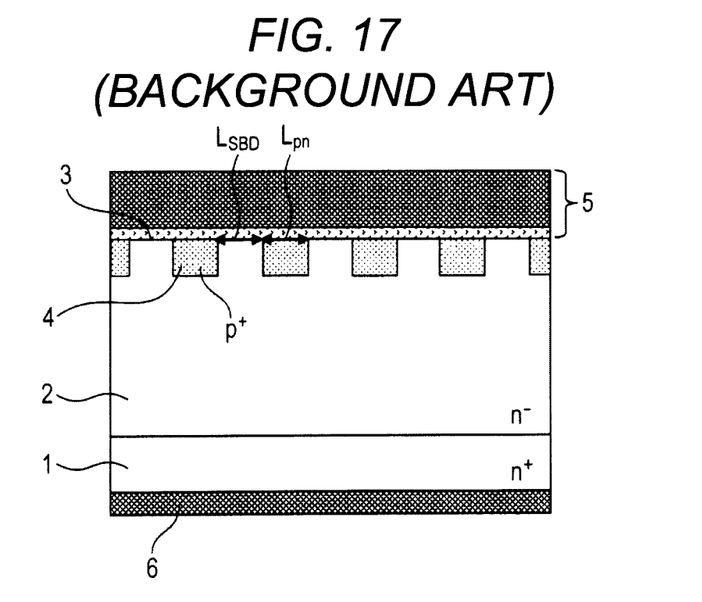
FIG. 17 is a cross sectional structural view of an existent planar type, junction barrier Schottky diode.

Japanese Unexamined Patent Application Publication No H05 (1993)-136015 discloses a junction barrier Schottky diode. The structure is shown in FIG. 17. FIG. 17 shows an n$^+$ SiC substrate 1 comprising SiC, an n$^-$ SiC drift layer 2, Schottky junction region 3, a p$^+$ SiC region 4, and an anode electrode 5 and a cathode electrode 6 of the Schottky diode, respectively. Further, at the surface of the n$^-$ SiC drift layer, the width of the p$^+$ SiC region is shown by $L_{pn}$ and the distance between adjacent p$^+$ SiC regions is shown by $L_{SBD}$.

In the JBS structure, for decreasing the electric field strength at the Schottky junction interface further, it is necessary to pinch off the area below the Schottky junction region at a lower reverse voltage, that is, it is necessary to make the Schottky region smaller. However, as the Schottky region decreases, since the current path is narrowed, the on resistance increases. Therefore, the electric field strength at the Schottky junction interface and the on resistance are in a trade-off relation. For improving the trade-off, a trench type junction barrier Schottky diode having a plurality of trenches formed in the surface of the drift layer and p$^+$ SiC region disposed at the inner wall thereof is effective.

Figure 18:
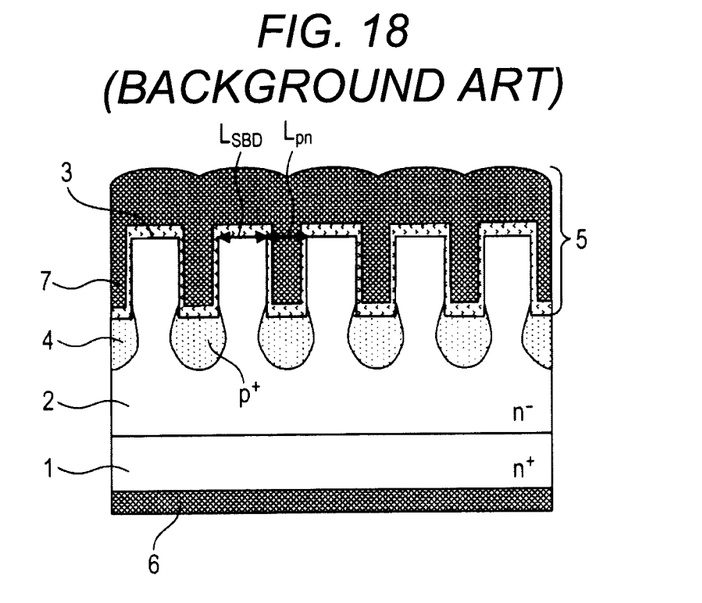
FIG. 18 is a cross sectional structural view of an existent trench type junction barrier Schottky diode.

Japanese Unexamined Patent Application Publication No H04(1992)-321274 discloses a trench type junction barrier Schottky diode. FIG. 18 shows a cross sectional structural view of a trench type junction barrier Schottky diode. A p$^+$ SiC region 4 is formed to the inner wall of the trench 7. In FIG. 18, portions carrying same references as those in FIG. 17 show identical portions in which an opening width of the trench 7 is shown as $L_{pn}$ and distance between each of the trenches is shown as $L_{SBD}$.

SUMMARY OF THE INVENTION

In the trench type junction barrier Schottky diode, when the device area is decreased intending to lower the capacitance or reduce the cost while maintaining the Schottky junction area as it is, or when the Schottky junction area is increased intending to increase the current or decrease the on resistance while keeping the device area as it is, it is necessary to decrease the opening width of the trench 7. However, decrease in the opening width of the trench 7 results in a problem that the electric field is concentrated to the p$^+$ SiC region below the trench 7 to deteriorate the device withstanding voltage.

The present invention intends to suppress the concentration of the electric field to the p$^+$ SiC region formed below the surface of a drift layer at the bottom of the trench 7 when the opening width of the trench 7 is decreased, thereby preventing deterioration of the device withstanding voltage in the trench type Schottky junction semiconductor device.

For attaining the purpose described above, the present invention includes the following typical means.

A method of manufacturing a Schottky junction type semiconductor device comprising: a silicon carbide substrate containing an impurity and having a first conduction type; a drift layer of a first conduction type formed over the substrate and having an impurity concentration lower than that of the substrate; a group of a plurality of first trenches each formed in the surface of the drift layer and having a bottom and a lateral side; a second conduction type impurity region formed so as to be in contact with the inner wall of the first trench; a Schottky junction region put between the first trenches of the group; a first electrode formed so as to be in contact with the surface of the drift layer; and second electrode formed to the rear face of the substrate, the method including: forming a sub-trench by engraving the periphery of the bottom of the first trench more deeply than the central portion; and ion implanting a second conduction type impurity to the inner wall of the first trench vertically to the surface of the substrate, thereby forming a second conduction type impurity region.

According to the aspect of the invention, even when the opening width of the trench in the trench type Schottky junction semiconductor device is decreased, electric field can be suppressed from concentrating to the p+ SiC region below the trench thereby preventing deterioration of the device withstanding voltage.

DETAILED DESCRIPTION OF THE PREFERRED EMBODIMENTS

The present invention is to be described more specifically with reference to preferred embodiments of the invention.

Figure 4:
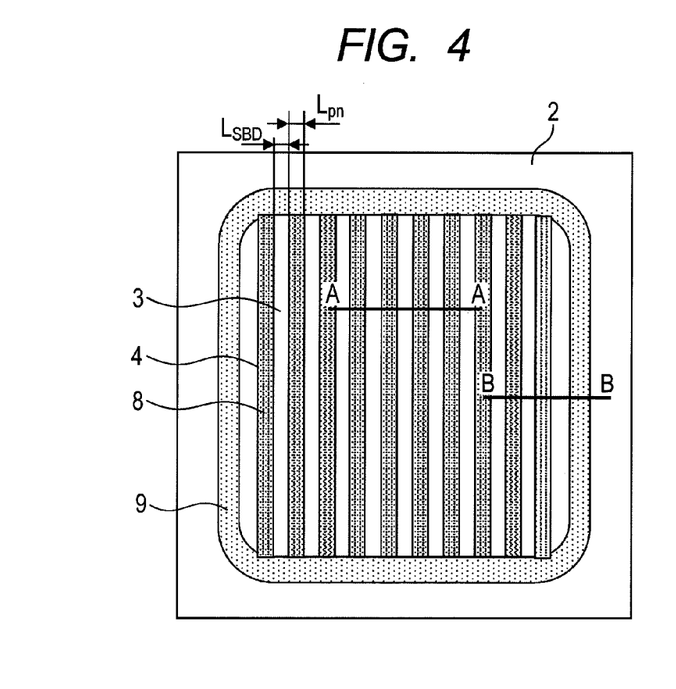
FIG. 4 is a planar structural view of a trench type junction barrier Schottky diode of first to the third embodiments.

FIG. 4 shows a planar structural view of a trench type junction barrier Schottky diode of first to third embodiments. FIG. 4 shows an n− SiC drift layer 2, a Schottky junction region 3, a linear shape p+ SiC region 4, and a termination trench 9 in a device termination portion surrounding the trench 7.

First Embodiment

Figure 1:
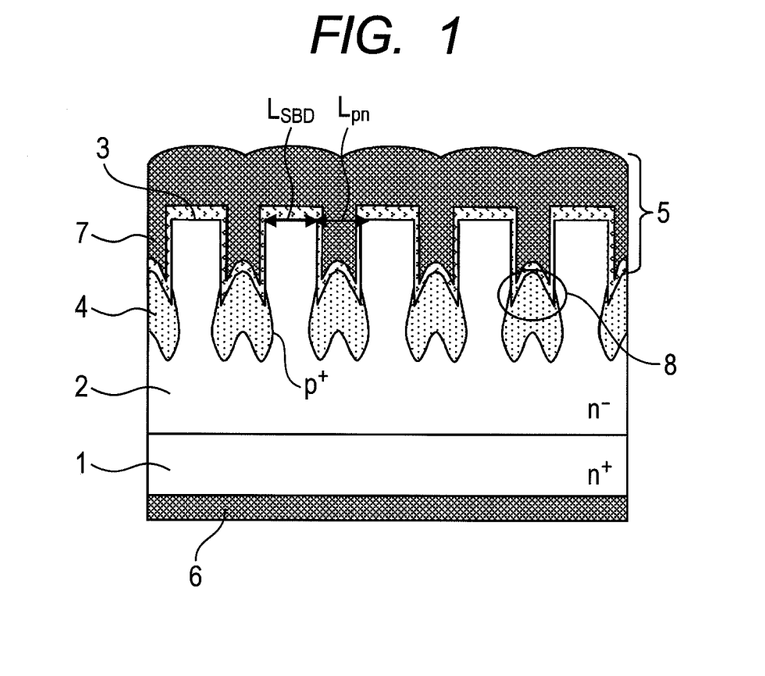
FIG. 1 is a cross sectional structural view of a trench type junction barrier Schottky diode of a first embodiment.

FIG. 1 is a cross sectional view along a line A-A in FIG. 4. FIG. 1 shows an n+ SiC substrate 1, a p+ SiC region 4, an anode 5 and a cathode 6 of a Schottky diode, and a sub-trench 8 in a trench 7, respectively. The sub-trench 8 is to described as a portion of the trench 7.

A pn junction region is formed at the interface between the n− SiC drift layer 2 and the p+ SiC region 4 disposed at the bottom (lower portion) of the trench 7 (sub-trench 8).

In FIG. 1, in the p+ SiC region 4 disposed at the bottom (lower portion) of the trench 7 (sub-trench 8), since the junction position is formed more deeply from the central portion to the periphery (end portion) of the bottom of the trench 7 (sub-trench 8) than the junction position at the central portion of the bottom of the trench 7 (sub-trench 8), when the opening width of the trench 7 (sub-trench 8) is made smaller, deterioration of the withstanding voltage by the concentration of the electric field to the p+ SiC region of the bottom of the trench 7 (sub-trench 8) can be suppressed.

Figure 5:
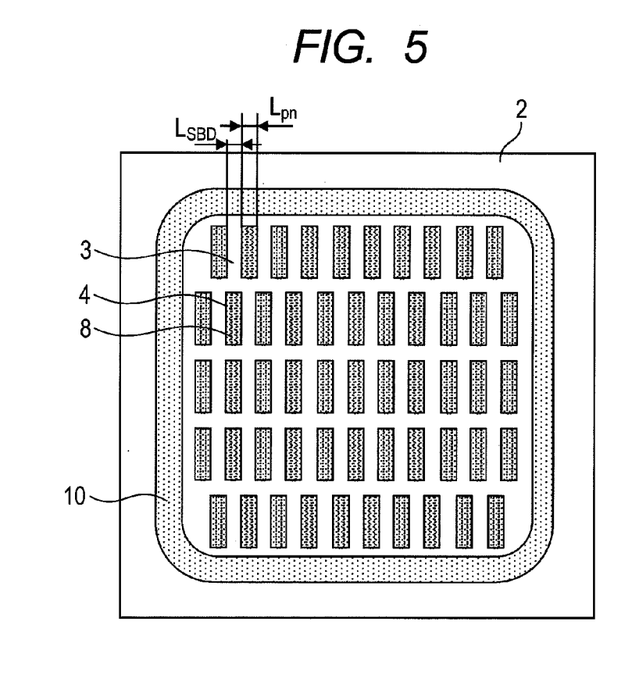
FIG. 5 is a planar structural view of the trench type junction barrier Schottky diode of the first to third embodiments.
Figure 6:
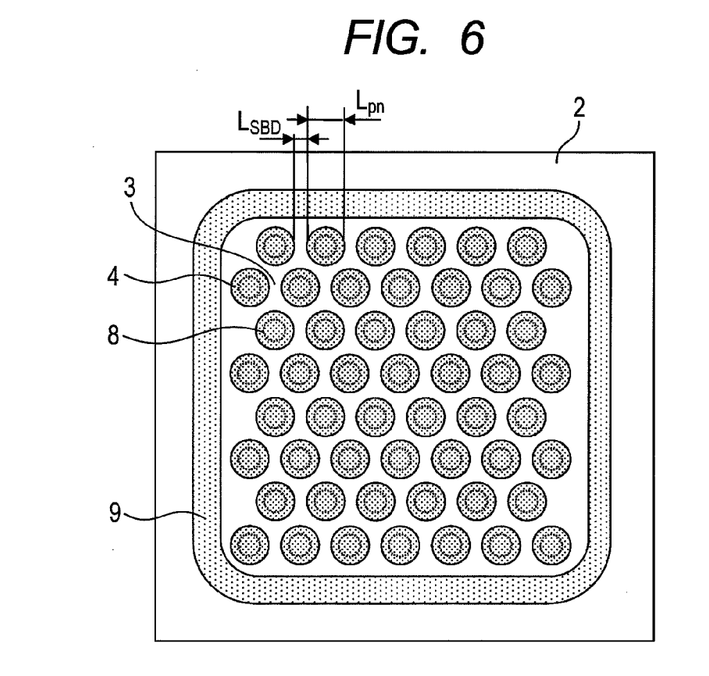
FIG. 6 is a planar structural view of the trench type junction barrier Schottky diode the first to third embodiments.
Figure 7:
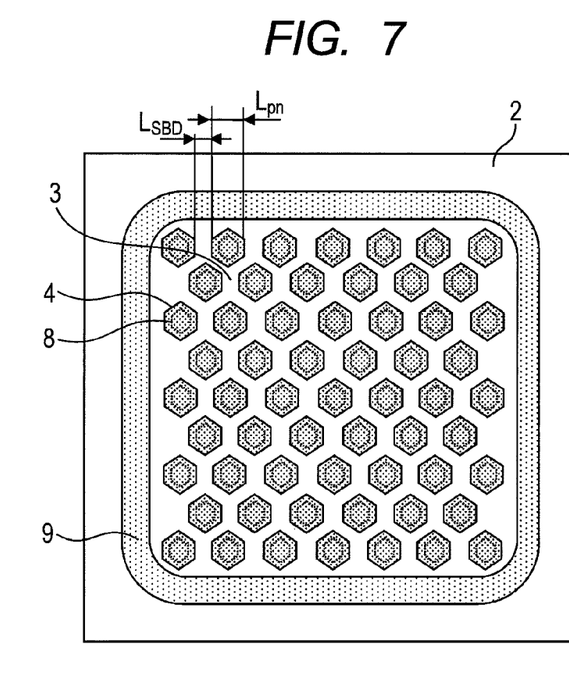
FIG. 7 is a planar structural view of the trench type junction barrier Schottky diode of the first to third embodiments.

In this embodiment, a linear shape pattern was used as shown in FIG. 4 as a layout for the p+ SiC region, but the layout may also be a rectangular pattern as shown in FIG. 5, dot pattern as shown in FIG. 6, or a hexagonal pattern as shown in FIG. 7. In FIG. 4, FIG. 5, FIG. 6 and FIG. 7, other references show identical portions carrying same references in FIG. 1.

Figure 8:
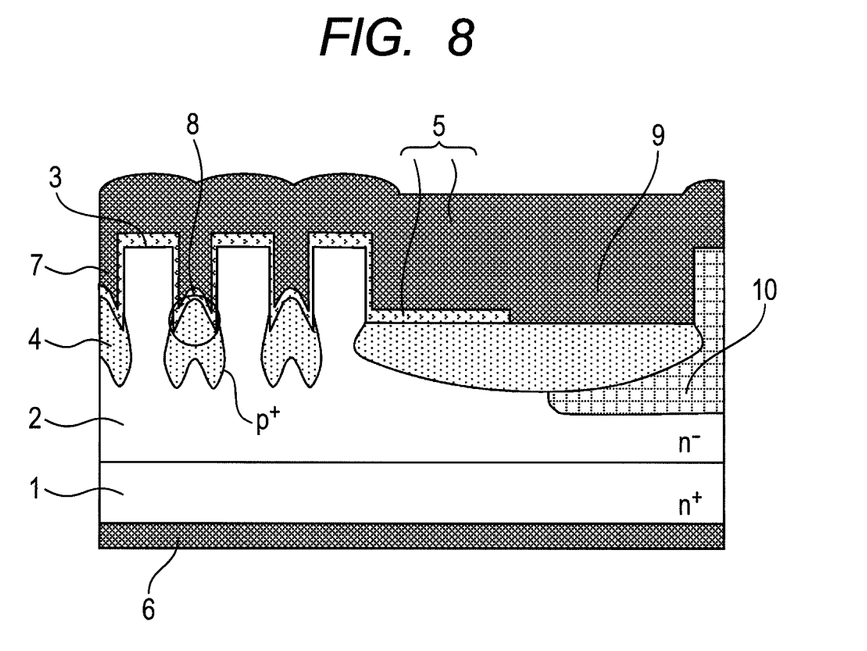
FIG. 8 is a cross sectional structural view for a termination region of the trench type junction barrier Schottky diode of the first to third embodiments.

FIG. 8 shows a cross sectional view along a line B-B in FIG. 4. Reference 10 shows a termination region including a device terminal end. This embodiment uses a junction terminal extension (JTE) structure in which a p region that surrounds a device functional portion in a stripe like shape is disposed in the termination region, but may be a field limiting ring (FLR) structure in which a plurality of p+ SiC regions are disposed in a ring-shape.

In any of the structures, for avoiding the concentration of the electric field near the terminal end of the device, the termination trench 9 has a wider opening width than the trench 7 formed in the central portion of the device, and the sub-trench 8 is not disposed to the bottom of the termination trench 9 near the device terminal end. Other references show identical portions in FIG. 1 carrying same references.

The description for the device termination portion is to be saved hereinafter and the cross sectional view only for the central portion of the device as a principal portion of the diode is shown while description for the termination region is to be omitted.

A manufacturing flow of the device structure in FIG. 1 is to be described with reference to FIG. 9A to FIG. 9D. Also in FIG. 9, only the central portion of the device as a main portion of the diode is shown and the description for the termination region is saved. The diode of this embodiment has a withstanding voltage of 600 V or higher.

At first, an n+ SiC substrate 1 was prepared. In this embodiment, an impurity concentration was at $2 \times 10^{18}$ cm$^{-3}$, the thickness of the substrate was 354 μm, and the main surface of the substrate was a (0001) face. The impurity concentration, the thickness of the substrate, and the main surface of the substrate may be used under other conditions.

At first, an n+ SiC drift layer 2 as a drain layer is formed to 8 μm thickness over the n+ SiC substrate 1. The electroconductivity is made identical with that of the n+ SiC substrate by using nitrogen as the impurity and the impurity concentration was set to $2 \times 10^{16}$ cm$^{-3}$.

Figures 9A, 9B, 9C, 9D:
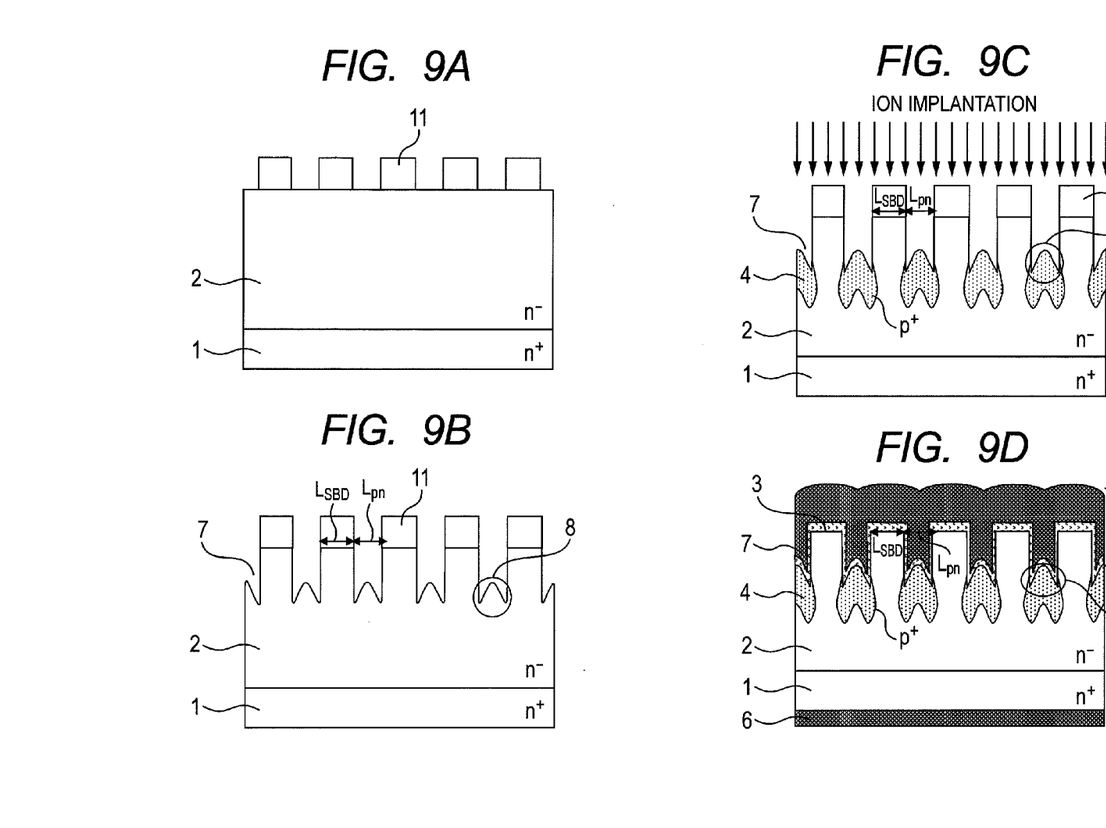
FIGS. 9A to 9D are explanatory views for manufacturing processes of the trench type junction barrier Schottky diode of the first embodiment.

Then, as shown in FIG. 9A, a silicon oxide film 11 is formed over the n− SiC drift layer 2, by a plasma CVD (Chemical Vapor Deposition) method and a plurality of openings are formed therein by using photolithography and dry etching.

Then, as shown in FIG. 9B, a trench 7 (including sub-trench 8) is formed in the n⁻ SiC drift layer 2 by dry etching using the silicon oxide film 11 as a mask. For the fabrication of the trench 7, a plasma etching apparatus based on a microwave ECR (Electron Cyclotron Resonance) plasma method was used. The gas used for the fabrication is a gas mixture of argon (Ar), methane trifluoride ($CHF_3$), and sulfur hexafluoride ($SF_6$) and etching was performed by a 60 W bias power under a pressure of 1.0 Pa. The electrode of the apparatus had a circular shape of 200 mm diameter and the bias power per unit area was 0.048 W/cm². Specifically, a reaction product was deposited to the central portion at the bottom of the trench 7 to weaken the etching effect compared with that at the periphery of the bottom to form a 200 nm sub-trench 8 thereby forming a trench 7. Further, in FIG. 9B, while, the opening width $L_{pn}$ of the trench 7 and the distance $L_{SBD}$ between the trenches 7 are different depending on the required performance, the effect of preventing deterioration of the withstanding voltage is remarkable when $L_{pn}$ is 1 μm or less. Details are to be described later.

Subsequently, as shown in FIG. 9C, ions are implanted in the direction vertical to the surface of the n⁻ SiC drift layer 2 by using the apertured silicon dioxide film 11 as a mask thereby forming a p⁺ SiC region 4 below the trench 7. In the p⁺ SiC region 4, since the sub-trench 8 is formed, the junction position is situated more deeply at the periphery of the bottom of the trench 7 (trench termination portion) than the junction position in the central portion at the bottom of the trench 7.

In this process, when the ions are implanted at an angle from a plane vertical to the surface of the n⁻ SiC drift layer 2, for example, obliquely at an angle of 30 degrees, impurity profile which is shallower in the central portion below the bottom of the trench 7 is, formed. However, the on resistance is increased in this case since the p⁺ SiC region 4 extends in the lateral direction to restrict the current path upon application of a forward voltage. Then, such degradation of the characteristic is substantially prevented by implanting ions in a direction vertical to the surface of the n⁺ SiC drift layer 2.

Aluminum was used as the p type dopant and annealing for activation was performed at 1700° C. Annealing temperature of 1700° C. was kept for 60 sec.

Finally, as shown in FIG. 9D, after forming Ni (100 nm)/Ti (25 nm) to the rear face of the n⁺ SiC substrate, it was annealed at 1000° C. for 120 sec to form an Ni silicide layer. Then, an anode electrode 5 of the Schottky diode was formed to the surface of the n⁻ SiC drift layer 2.

A trench type junction barrier Schottky diode of the first embodiment is obtained by the manufacturing flow described above.

Figure 10:
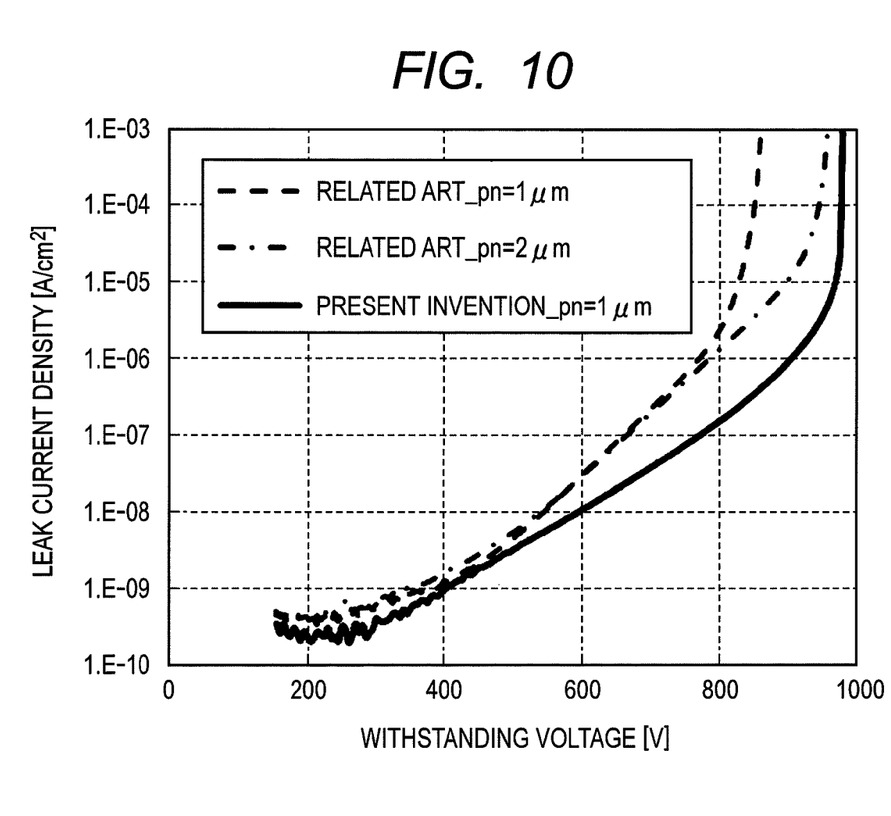
FIG. 10 is a reverse current/voltage characteristic graph of the trench type junction barrier Schottky diode of the first embodiment.

FIG. 10 shows a result of evaluating the reverse characteristic of the trench type junction barrier Schottky diode of the first embodiment and comparing the characteristic with that of the trench type junction barrier Schottky diode as an existent embodiment in FIG. 18.

In the first embodiment, the distance $L_{SBD}$ between the trenches 7 was 1 μm, the depth of the trench 7 (sub-trench 8) was 1 μm, and the height (depth) of a convex portion in the central portion of the sub-trench 8 was 200 nm. The depth of the trench 7 in the existent embodiment was 1 μm in the same manner as in the first embodiment. The reverse characteristic of the existent embodiment at 2 μm opening width $L_{pn}$ of the trench 7 was 958 V of withstanding voltage (defined as a voltage at a leak current of 1 mA/cm²) as shown in the dotted chain in FIG. 10. When the device area was decreased as $L_{pn}$=1 μm while maintaining the Schottky junction area as it was, the withstanding voltage was lowered to 862 as shown by the dotted line in FIG. 10. On the other hand, referring to the reverse characteristic of the first embodiment, deterioration of the device withstanding voltage could be prevented even when the opening width $L_{pn}$ of the trench 7 (sub-trench 8) was decreased to 1 μm as shown by a solid line in FIG. 10. withstanding voltage of 975 V was obtained, which is equal to, or higher than that for the 2 μm opening width $L_{pn}$ of the trench 7 in the existent embodiment, and a withstanding voltage higher by 100 V than that at the 1 μm opening width $L_{pn}$ of the trench 7 in the existent embodiment.

Figure 11:
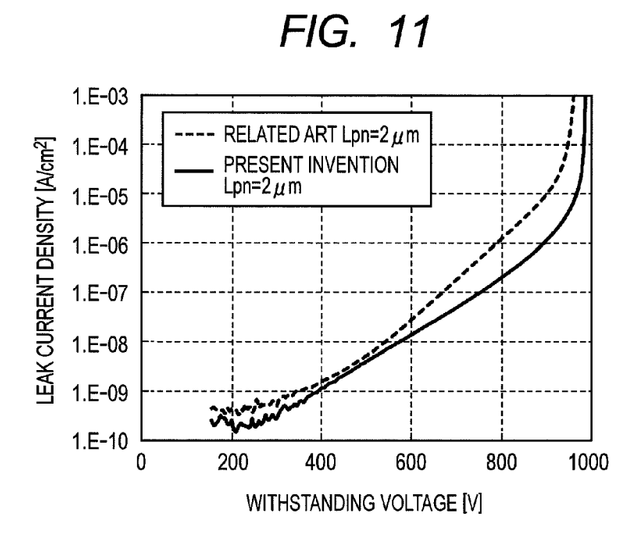
FIG. 11 is a reverse current/voltage characteristic graph of the trench type junction barrier Schottky diode of FIG. 12 is a reverse current/voltage characteristic graph of the trench type junction barrier Schottky diode of the first embodiment.
Figure 12:
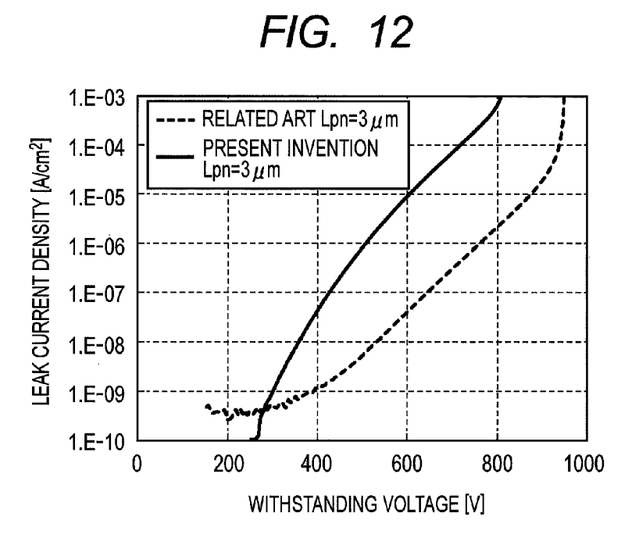

Then, the reverse characteristic of the first embodiment at the opening width $L_{pn}$ of the trench 7 (sub-trench 8) of 2 μm or more is shown in FIG. 11 and FIG. 12. When the opening width $L_{pn}$ of the trench 7 (sub-trench 8) (of the embodiment) was 2 μm or more, the withstanding voltage in the existent example not providing with the sub-trench 8 was 958 V as shown in the dotted line in FIG. 11. On the other hand, the withstanding voltage of the first embodiment was 980 V as shown by the solid line in FIG. 11 and it can be seen that remarkable effect is obtained in a case of $L_{pn}$=1 μm. FIG. 12 shows a result of comparison at a 3 μm opening width of the trench 7 (sub-trench 8) for the characteristics of the first embodiment and the existent embodiment of the trench type junction barrier Schottky diode. The withstanding voltage in the existent trench type junction barrier Schottky diode not provided with the sub-trench 8 was 942 V as shown in the dotted line in FIG. 12. On the other hand, the withstanding voltage was 800 V in the case of the first embodiment as shown by the solid line in FIG. 12 and the device withstanding voltage was deteriorated. That is, it can be seen that the opening width of the trench 7 (sub-trench 8) is preferably 1 μm or less.

In this embodiment, a linear pattern was used for the layout of the p⁺ SiC region as shown in FIG. 4 but the layout for the p⁺ SiC region may be a rectangular pattern as shown in FIG. 5, a dot pattern as shown in FIG. 6, or a hexagonal pattern as shown in FIG. 7.

Second Embodiment

Figure 2:
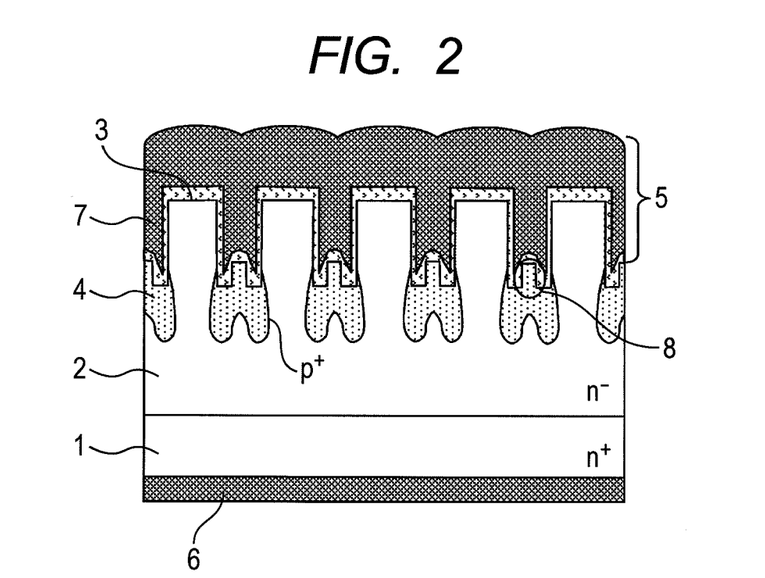
FIG. 2 is a cross sectional structural view of a trench type junction barrier Schottky diode of a second embodiment.

FIG. 2 is a cross sectional structural view of second embodiment. Different from the first embodiment, the cross sectional shape of the sub-trench 8 of the inverted trigonal shape in first embodiment was changed into a rectangular shape.

Also in this embodiment, the layout for the p⁺ SiC region may be a linear pattern as shown in FIG. 4, rectangular pattern as shown in FIG. 5, a dotted pattern as shown in FIG. 6, or a polygonal (hexagonal) pattern as shown in FIG. 7.

Third Embodiment

Figure 3:
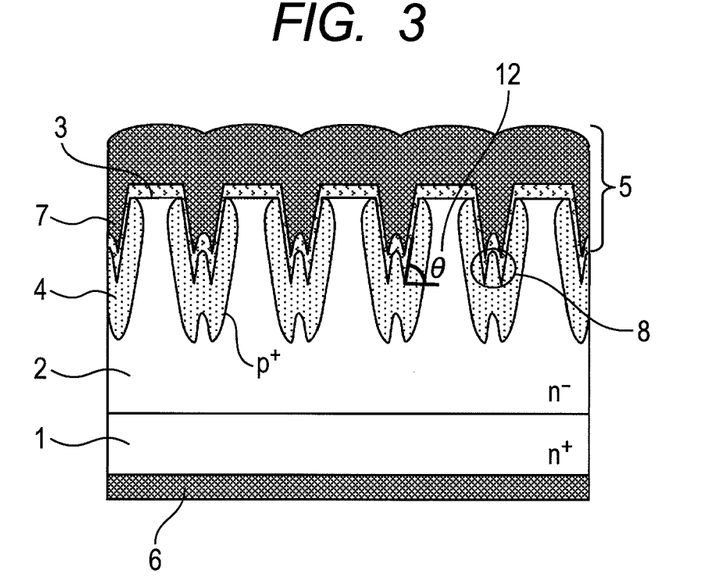
FIG. 3 is a cross sectional structural view of a trench type junction barrier Schottky diode of a third embodiment.

FIG. 3 is a cross sectional structural view of a third embodiment of the present invention. This embodiment is different from first embodiment in that the lateral side of trench 7 is not vertical to the surface of the drift layer 2 but is inclined therefrom. Reference 12 represents a tapered angle θ on the lateral side of the trench 7. Since the shape of the p⁺ SiC region 4 in contact with the inner wall of the trench 7 changes by forming the lateral side of the trench 7 not vertical to the surface of the drift layer 2 but being inclined at the tapered angle 12, the electric field strength in the Schottky junction region 3 changes and the extension of the current path of the on current also changes and optional design is possible for obtaining a desired characteristic. In this embodiment, a trench below the central protrusion is a sub-trench 8.

In this embodiment, a linear pattern was used for the layout of the p⁺ SiC region as shown in FIG. 4, the layout for the p⁺

SiC region may also be a rectangular pattern as shown in FIG. 5, a dotted pattern as shown in FIG. 6, or a hexagonal pattern as shown in FIG. 7.

Figure 13A:
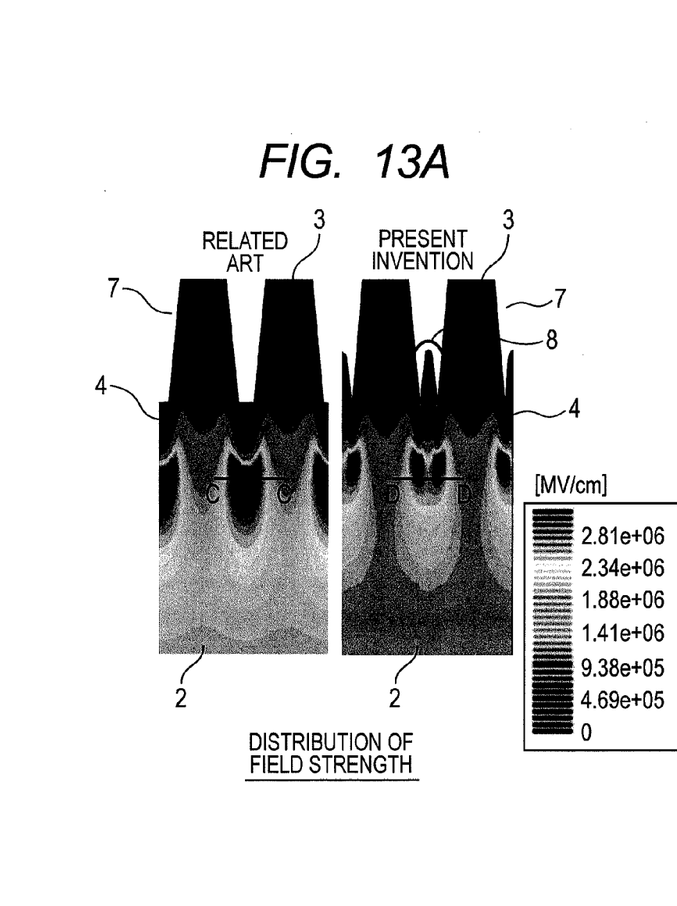
FIGS. 13A and 13B respectively show the distribution of electric field strength and distribution of current density of the trench type junction barrier Schottky diode in the third embodiment in comparison with the related art.
Figure 13B:
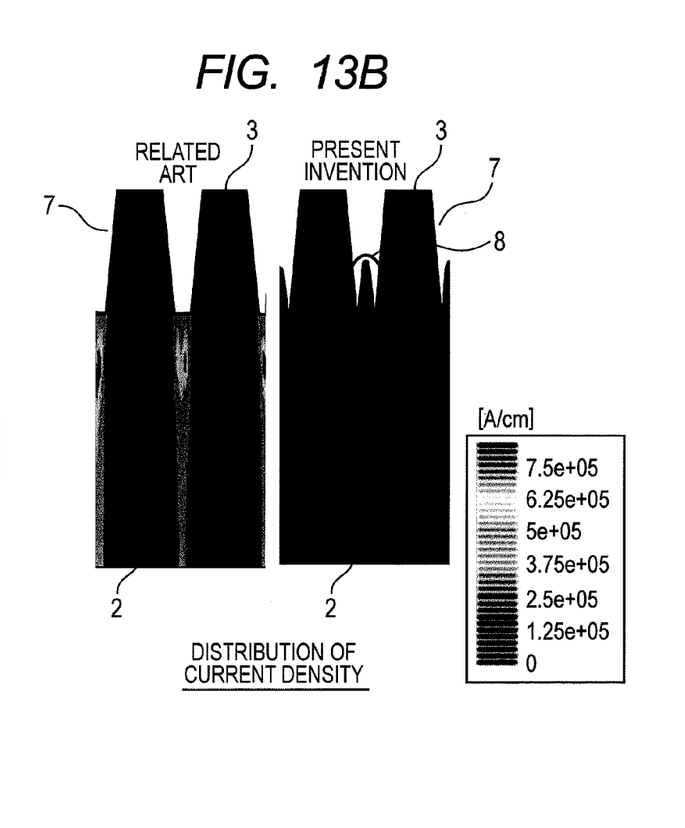

Successively, the effect of the invention is to be described specifically by using the result of simulation. FIG. 13A and FIG. 13B compares the distribution of the electric field strength and the distribution of the current density respectively between the existent trench type junction barrier Schottky diode (FIG. 18) and those of the third embodiment=1 μm, (FIG. 3). Both of them show the result of calculation when setting the opening width of the trench 7 as: $L_{pn}=1$ μm, the depth as 1 μm. the distance of the trench 7 as: $L_{SBD}=1$ μm, the height of the sub-trench 8 as 400 nm, the taper angle as 12 to 73 degree, and applying 1000 V in the reverse direction. As shown in FIG. 13A, the electric field is concentrated in the $p^+$ SiC region situated at the central portion of the trench 7 in the existent example, and a leak current flows from the portion where the electric field is concentrated as shown in FIG. 13B.

On the other hand, in this embodiment, as shown in FIG. 13A, the $p^+$ SiC region 4 formed below the trench 7 is formed such that the junction position is situated more deeply in the periphery at the bottom of the trench 7 than the junction position in the central portion of the bottom of the trench 7. Accordingly, concentration of the electric field generated in the existent example is moderated and the leak current is decreased as shown in FIG. 13B (not flowing substantially).

Figure 14:
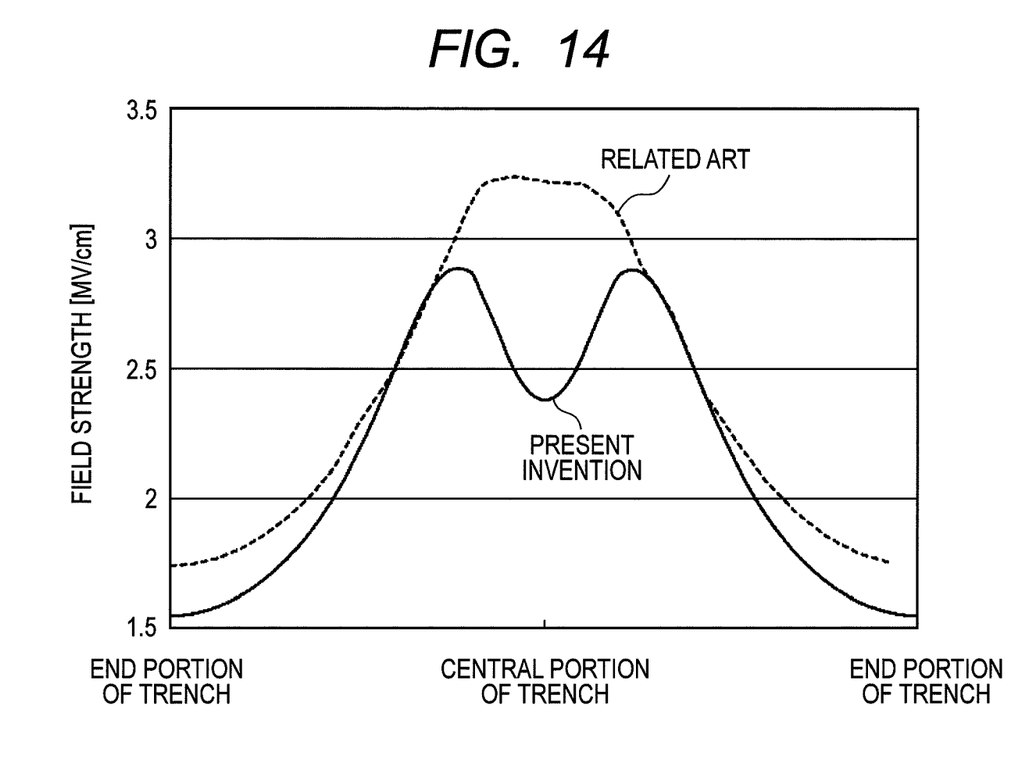
FIG. 14 is a graph showing the electric field profile of the trench type junction barrier Schottky diode of the third embodiment in comparison with the existent embodiment.

FIG. 14 shows the distribution of the electric field strength along lines C-C and D-D in FIG. 13. In the existent embodiment, an electric field is concentrated to the $p^+$ SiC region in the central portion of the trench 7 in which the electric field strength takes a maximum value at the center of the trench 7, which exceeds 3 MV/cm as the dielectric breakdown field of SiC.

On the other hand, in the third embodiment, the $p^+$ SiC region 4 below the trench 7 is formed such that the junction position in the periphery (end portion) of the trench 7 is formed more deeply than the junction position in the central portion of the trench 7. The electric field is decreased in the central portion of the trench 7 and the maximum value does not exceed 3 MV/cm.

As described above, since the $p^+$ SiC region 4 is formed such that the junction position is situated more deeply in the periphery of the bottom of the trench 7 (trench termination portion) than the junction position in the central portion of the bottom of the trench 7, it is possible to prevent the concentration of the electric field to the $p^+$ SiC region below the trench 7 thereby prevent deterioration of the withstanding voltage.

Figure 15:
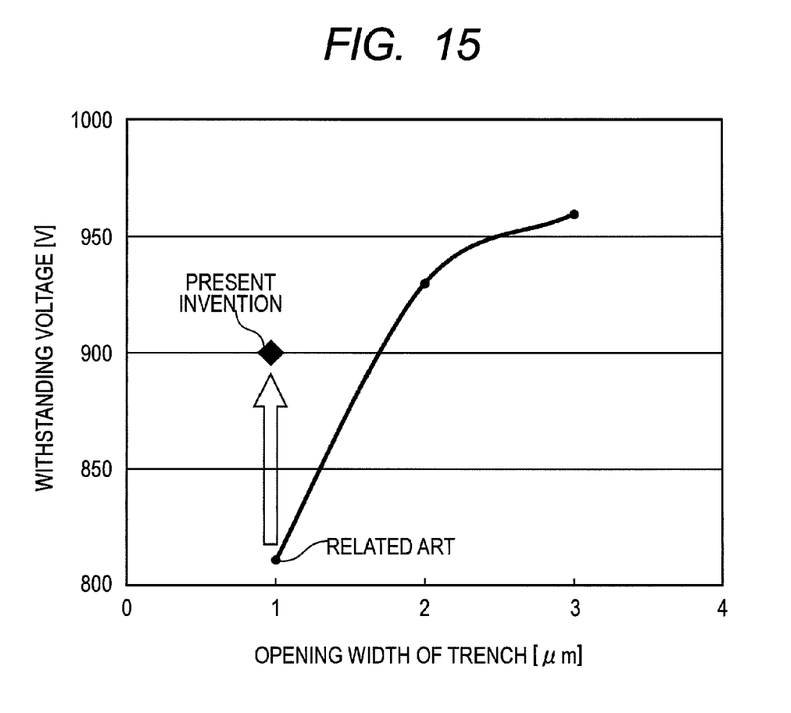
FIG. 15 shows the result of calculation on the relation between the opening width of a trench 7 and the withstanding voltage of the trench type junction barrier Schottky diode of the third embodiment.

FIG. 15 shows the result of calculation on the relationship between the opening width $L_{pn}$ of the trench 7 and the withstanding voltage. It was set such that the of the trench 7 was 1 μm, the height of the sub-trench 8 (height of the convex portion in the center of the sub-trench 7) was 400 nm, the distance $L_{SBD}$ between the trenches 7 was 1 μm, and the taper, angle 12 was 73 degree. In the existent embodiment, when the opening width $L_{pn}$ of the trench 7 was decreased from 3 μm to 1 μm, electric field concentration tended to occur and the withstanding voltage was lowered by about 150 V. In the third embodiment, degradation of the withstanding voltage could be suppressed to about 60 V even when, the opening width of the trench 7 is decreased to 1 μm and a withstanding voltage higher by about 100 V than the existent embodiment can be maintained.

Figure 16:
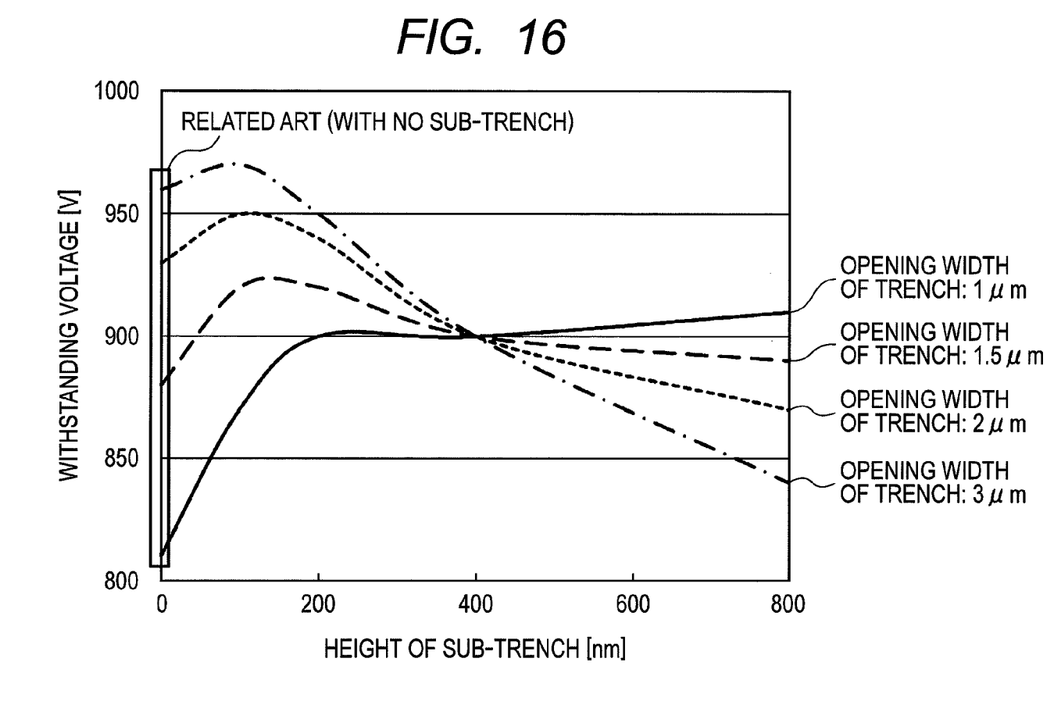
FIG. 16 shows the result of Calculation on the relation between the height of the sub-trench 8 and the withstanding voltage of the trench type junction barrier Schottky diode of the third embodiment.

FIG. 16 shows the result of calculation on the relationship between the height of the sub-trench 8 and the withstanding voltage when the opening width $L_{pn}$ of the trench 7 was set to 1 μm, 1.5 μm, 2 μm, and 3 μm. The depth of the trench 7 was set to 1 μm and the distance $L_{pn}$ between the trenches 7 was set to 1 μm. As the opening width $L_{pn}$ of the trench 7 was increased as 1.5 μm, 2 μm, and 3 μm, the withstanding voltage was deteriorated by the formation of the sub-trench 8. Accordingly, the sub-trench 8 was not provided at the bottom of the termination trench 9 in the terminal end of the device where the opening was wide. When the opening width of the trench 7 was decreased as far as 1 μm, the withstanding voltage is improved by providing the sub-trench 8. It was confirmed that the height of the sub-trench 8 should be 200 nm or more and the effect thereof is identical at the height of 800 nm of the sub-trench 8.

While each of the embodiments has been described with reference to the trench type junction barrier Schottky diode used, alone, the same effect can also be obtained in a case, for example, of applying the Schottky diode to a junction FET (JFET) as a switching element or to an MOSFET diode portion in a device hybridized with the MOSFET.

What is claimed is:

1. A Schottky junction type semiconductor device, comprising:
   a first conduction type silicon carbide substrate;
   a silicon carbide layer including:
      a first conduction type first region with a lower impurity concentration than that of the silicon carbide substrate, and
      a second conduction type second region;
   a trench, formed in the first conduction type first region of the silicon carbide layer, including a bottom surface having a central portion and a peripheral portion situated at a greater depth than the central portion;
   a first electrode in Schottky junction relative to the first conduction type first region of the silicon carbide layer, a portion of the first electrode extending into the trench; and
   a second electrode in ohmic contact relative to a rear face of the silicon carbide substrate,
   wherein the second conduction type second region of the silicon carbide layer is situated adjacent to at least the bottom surface of the trench.

2. The Schottky junction type semiconductor device according to claim 1,
   wherein an opening width of the trench is 1 μm or less.

3. The Schottky junction type semiconductor device according to claim 1,
   wherein a depth of the peripheral portion of the bottom surface of the trench is 200 nm or more than the central portion of the bottom surface of the trench.

4. The Schottky junction type semiconductor device according to claim 1,
   wherein the trench has a tapered inner wall that gradually increases in a width upwardly.

5. The Schottky junction type semiconductor device according to claim 1,
   wherein the second conduction type second region of the silicon carbide layer is further situated adjacent to a side wall of the trench.

* * * * *